US006456208B1

(12) United States Patent
Nazari et al.

(10) Patent No.: US 6,456,208 B1
(45) Date of Patent: Sep. 24, 2002

(54) TECHNIQUE TO CONSTRUCT 32/33 AND OTHER RLL CODES

(75) Inventors: Nersi Nazari, Cupertino; Andrei Vityaev, Santa Clara, both of CA (US)

(73) Assignee: Marvell International, Ltd., Hamilton (BM)

( * ) Notice: Subject to any disclaimer, the term of this patent is extended or adjusted under 35 U.S.C. 154(b) by 3 days.

(21) Appl. No.: 09/607,904

(22) Filed: Jun. 30, 2000

(51) Int. Cl.[7] ............................................. H03M 7/00
(52) U.S. Cl. ................................... 341/59; 341/81
(58) Field of Search ...................... 341/59, 81

(56) References Cited

U.S. PATENT DOCUMENTS

| | | | | |
|---|---|---|---|---|
| 4,888,779 A | * | 12/1989 | Karabed et al. | 371/43 |
| 5,537,424 A | * | 7/1996 | Karabed et al. | 371/43 |
| 5,544,178 A | * | 8/1996 | Zook | 371/43 |
| 5,604,497 A | * | 2/1997 | Sonntag | 341/50 |
| 5,608,397 A | * | 3/1997 | Soljamin | 341/58 |
| 5,635,933 A | * | 6/1997 | Fitzpatrick et al. | 341/58 |
| 5,717,395 A | * | 2/1998 | Zook | 341/59 |
| 5,748,119 A | * | 5/1998 | Ko | 341/59 |
| 5,757,294 A | * | 5/1998 | Fisher et al. | 341/58 |
| 5,757,822 A | * | 5/1998 | Fisher et al. | 341/58 |
| 5,767,798 A | * | 6/1998 | Won | 341/59 |
| 5,781,130 A | * | 7/1998 | McLaughlin et al. | 341/56 |
| 5,799,033 A | * | 8/1998 | Baggen | 375/200 |
| 5,910,969 A | * | 6/1999 | Sayiner et al. | 375/341 |
| 6,130,629 A | * | 10/2000 | Aziz et al. | 341/50 |
| 6,184,806 B1 | * | 2/2001 | Patapoutian et al. | 341/59 |
| 6,313,764 B1 | * | 11/2001 | Nakagawa et al. | 341/59 |

FOREIGN PATENT DOCUMENTS

EP          1058432 A2      5/2000

* cited by examiner

Primary Examiner—Michael Tokar
Assistant Examiner—Khai Nguyen
(74) Attorney, Agent, or Firm—Eric B. Janofsky

(57) ABSTRACT

In this invention a thirty three bit word is encoded from a thirty two bit word to conform to RLL coding constraints. A parity bit is added to the coded word after coding is complete. With the parity bit inserted the code satisfies a minimum Hamming weight of nine and no more than eleven consecutive zeros and no more than eleven consecutive zeros in both the odd and even interleaves. A table of "bad" eight bit sequences is used to compare the odd and even interleaves of the right and left halves of the input word that is being encoded. If a "bad" sequence is found, its position in the table points to a second table containing a four bit replacement code that is inserted into the coded output word. Flag bits in the output coded word are set to indicate the violation of the coding constraints and provide a means by which a decoder can be used to reverse the process and obtain the original input word.

30 Claims, 10 Drawing Sheets

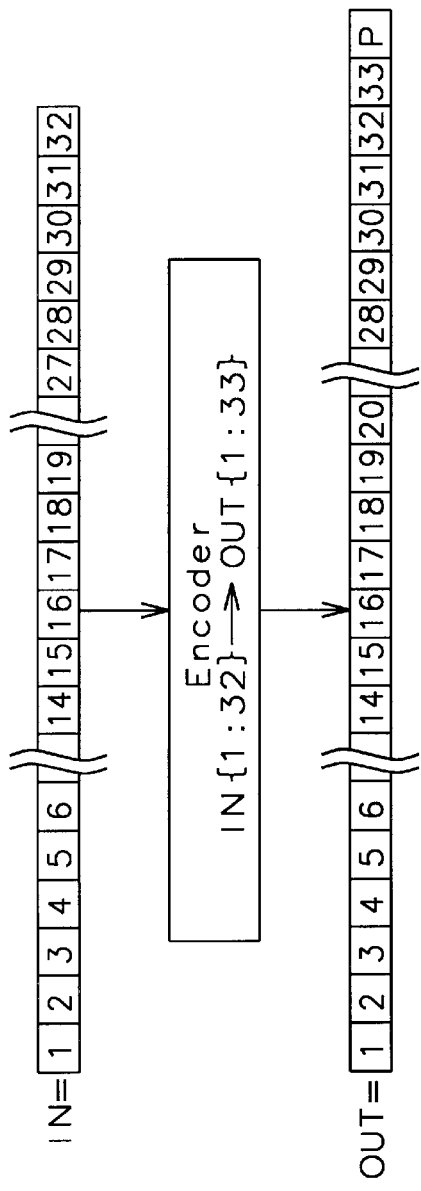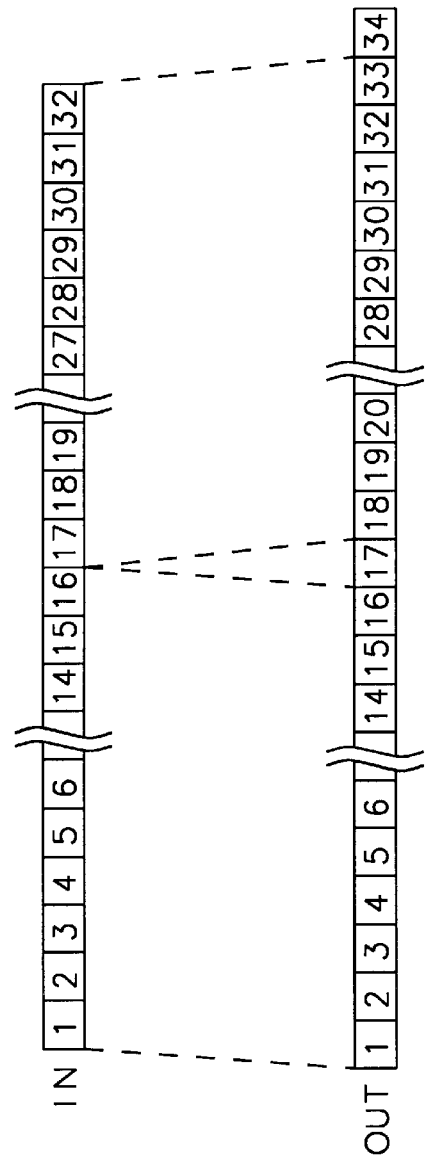
FIG. 1a
FIG. 1b

| TABLE A | TABLE B |
|---|---|
| 00000000 | 1111 |
| 00000001 | 0111 |
| 00000010 | 1110 |
| 00000100 | 1100 |
| 00001000 | 0110 |
| 00010000 | 0011 |
| 00100000 | 1010 |
| 01000000 | 0101 |
| 10000000 | 1001 |
| 11000000 | 0010 |
| 00000011 | 0100 |
| 10000001 | 1000 |
| 10000010 | 1101 |
| 10000011 | 1011 |
*FIG. 2*
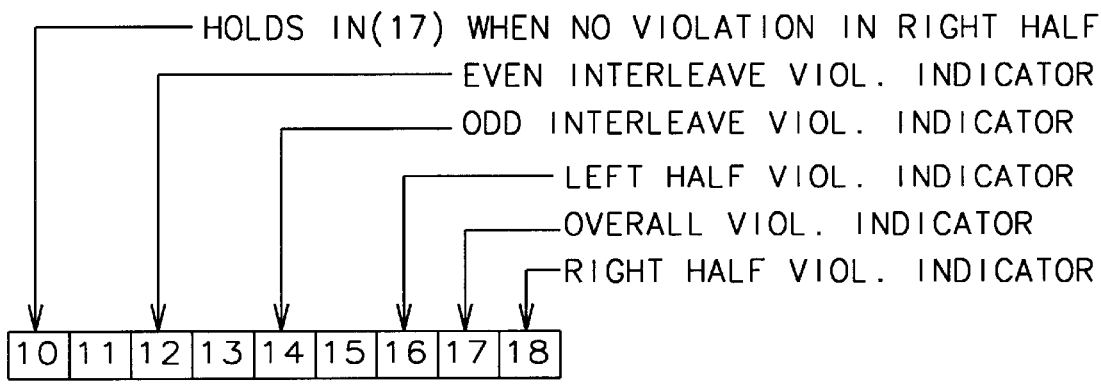
*FIG. 3a*
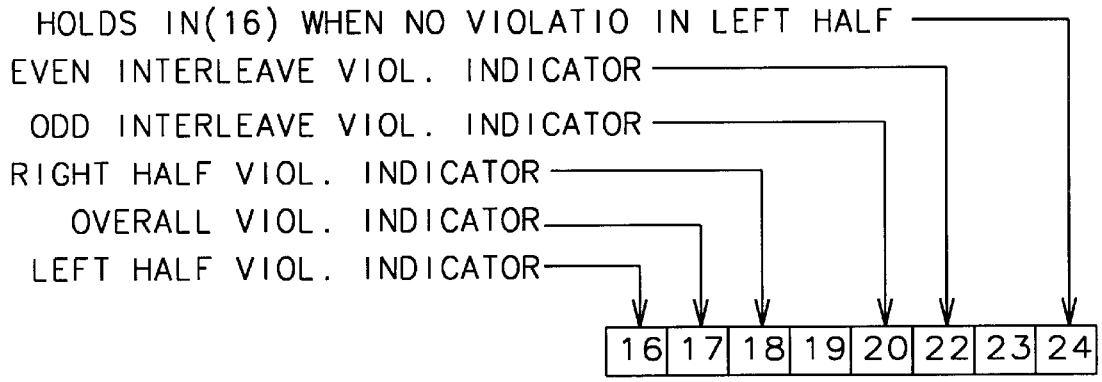
*FIG. 3b*

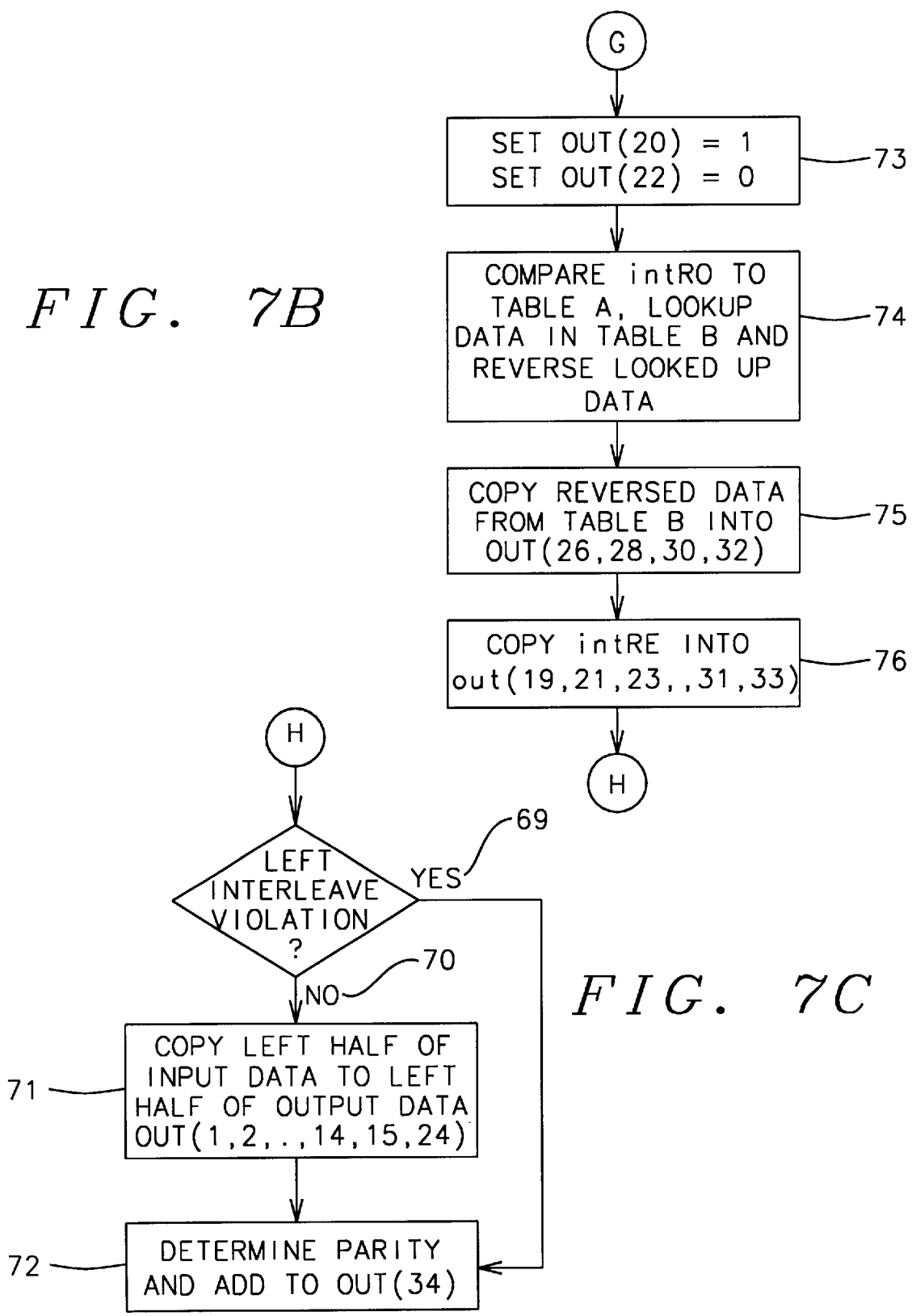

TECHNIQUE TO CONSTRUCT 32/33 AND OTHER RLL CODES

BACKGROUND OF THE INVENTION

1. Field of Invention

This invention relates to encoding a digital word and more specifically to a run length limited encoding of a digital word.

2. Description of Related Art

In current digital data communication and digital data storage systems the processes of encoding and decoding are frequently utilized. During the encoding process the input stream of 0's and 1's is convert into another stream of 0's and 1's. The encoded stream usually contains more bits than the original uncoded stream. For example, encoding process could have data divided into words of 32 bits which are then converted into coded words, each 33 bits long. Such an encoding process is referred to as a rate of 32/33.

In U.S. Pat. No. 5,781,130 (McLaughlin et al.)( a system for encoding a digital word with an M-ary(d,k) code is disclosed. The multilevel coded data for M>2 is a result of an M-ary encoder that produces a run length limited code for multilevel data storage and/or data communications. In U.S. Pat. No. 5,748,119 (Ko) channel encoding and decoding methods are described which use an EFM code with a reduced number of merging bits. An m-bit input word is encoded to an (n−d+1) bit channel word by an encoding table. One or more merge bits are added encoded channel word to form a n-bit channel word. In U.S. Pat. No. 5,604,497 (Sonntag) a method and apparatus is disclosed for increasing the density of run length limited block codes without increasing error propagation. This is accomplished by inserting "M" uncoded bytes between each coded byte which increases the coding density.

The goal of encoding is to produce a stream of bits better suited for digital transmission or digital recording. One common objective is to guarantee that the encoded stream can not have more than a predetermined number "n" of consecutive zeros. This coding requirement is referred to as (0,n) Run Length Limited (RLL) constraint. During the digital transmission or digital recording, logical 1's are often modulated as a pulse and logical 0's are modulated as no pulse. The long runs of consecutive zeros result in long periods with no pulses which make it difficult to perform timing and gain recovery of the transmitted or stored signal. There is another important type of constraint which is commonly referred to as (0,G/I) constraint. Here the encoded stream can not have more than "G" consecutive zeros and after the encoded sequence of bits is divided into the odd-number and even-numbered sub sequences then neither of these sub sequences can have more than "I" consecutive zeros. The need for utilizing the (0,G/I) constraint streams from the use of Viterbi detection. Therefore, it is desirable to design an encoder which has a high rate, e.g. 32/33 or 64/65, has low implementation complexity and which satisifies a (0,G/I) RLL constraints with small values of G and I.

SUMMARY OF THE INVENTION

In the present invention a method for encoding an input digital word is shown that results in an output digital word that is one bit longer than the input digital word before parity bit is added. The output digital word satisifies a run length limited (RLL) (0,11/11) constraint and a Hamming weight of nine. Having a Hamming weight of "9" means that the number of logical ones in a word is at least nine.

As an example, a thirty two bit word can be encoded into a thirty three bit word plus a parity bit. The thirty two bit input word can be defined as IN={in(1), in(2), ... in(32)} and the thirty three bit output word can be defined as OUT={out(1), out(2), ... out(33)}. If the input word, IN, satisfies the coding constraints of (0,11/11) and a Hamming weight of at least nine, the input word split in half can be directly transferred to the output word as OUT={IN(LH), out(17), IN(RH)}, where IN(LH)={in(1), in (2), ... in(16)} is the left half of the input code word, out(17) is the seventeenth bit position of the output code word, and IN(RH)={in(16), in (17), ... in(32)} is the right half of the input code word. For convenience of demonstration and consistency with programs such as MATLAB the notation in(16:32) will be used instead of {in(16), in(17), ... in(32)}. The left half of the input word maps directly into the same numbered bit positions in the left half of the output code word, and the right half of input word maps into a numbered bit position one bit higher in order to accommodate out(17) which is set to a logical one to indicate that there was no violations of the coding constraints in the input word.

In order to analyze the thirty two bit input word and insure that the even and odd interleaves satisfy the coding constraints, the input word needs to be further subdivided into IN={intLO, intLE, intRO, intRE} where intLO={in(1), in(3), in(5), ... in(15)}, intLE={in(2), in(4), in(6), ... in(16)}, intRO={in(17), in(19), in(21), ... in(31)}, and intRE={in(18), in(20), in(22), ... in(32)}. Each of these interleaves is eight bits long. A table of "bad" eight bit words, such as Table A in FIG. 2, is established to compare against the eight bit interleaves. The eight bit words in Table A are sometimes called "violations", and Table A was established to facilitate analysis, minimize global constraints, minimize interleave constraints and eliminate low Hamming weights. Table A is used as a pointer to a four bit replacement, shown in Table B in FIG. 2, for the interleave that is in violation of the coding constraints.

When either right interleave, intRO and intRE, is found to be identical to one of the eight bit words in Table A, the corresponding four bit word in Table B is selected, reversed and substituted for the interleave in violation. For instance, if the violation is 10000011, the last one in Table B, the replacement code is 1101 which is the reverse of the last code in Table B. If the violation is in intLO or intLE, then intLO or intLE are reversed, compared to Table A to select the replacement four bit code. For example, if intLO= 11000001, the reverse is 10000011 which selects 1011 from Table B.

The coded output word from the encoder can be represented as OUT={out(1), out(2), out(3), ... out(32), out(33), out(34)}, where out(34) is the added parity bit after coding is finisher. Once a violation is detected the middle bit position in the coded output word is set to out(17)=0 which becomes the overall violation indicator. If the left half of the input word IN has a violation, out(16)=1, and for a right half violation, out(18)=1. If there is an odd interleave violation, out(14)=1, for the left half of the input word, and out(20)=1 for a violation for the right half of the input word. When there is an even interleave that is in violation, out(12)=1 for a violation in the left half and out(22)=1 for a violation in the right half. Each of the flag bits out(12), out(14), out(16), out(18), and out(20) are a logical "0" if there is not a violation. If only on interleave in the left half is in violation, the selected four bit code word from Table B is inserted into outLE(2, 4, 6, 8) and the valid interleave, either intLE or intLO, is copied from the input word to OUT{LHO}=out(1), out(3), ... out(15), where OUT{LHO} is the odd interleave in the left half of the output word. When the left half violation flags are both set to out(14)=1 and out(12)=1, both interleaves are replaced by a four bit violation code from Table B in the first four positions in both interleaves, leaving out(9), out(11), out(13) and out(15) unused and each filled with a logical one. When there is no violation, out(17)=1, out(18)=in(17), but when a violation is detected, out(17)=0, bit position out(18) is used to indicate whether the violation is in the right half; therefore, bit position out(10) is used to contain in(17) when out(17) indicates a violation and the right half of the output code word does not have a violation out(18)=0.

If the right half of the input word has a violation, the right half violation indicator, out(18)=1, out(20)=1 for a violation in the odd interleave of the right half of the input word, and out(22)=1 for a violation in the even interleave of the right half of the input word. If only one interleave in the right half is in violation, the selected four bit code word from Table B is reversed and inserted into outRE(26, 28, 30, 32) and the valid interleave, iether intLE or intLO, is copied from the input word to OUT{RHO}=out(19), out(21), . . . out(33), where OUT{RHO} is the odd interleave in the right half of the output word. When he left half violation flags are set to out(20)=1 and out(22)=1, both interleaves are replaced by a reversed four bit violation code from TABLE B in the last four positions in both interleaves, leaving out(19), out(21), out(23) and out(25) unused and each filled with a logical one. When there is no violation, out(17)=1, out(16)=in(16), but when a violation is detected, out(17)=0, bit position out(16) is used to indicate whether the violation is in the left half; therefore, bit position out(24) is used to contain in(16) when out(17) indicates a violation and the left half of the output code word does not have a violation out(16)=0.

There is additional encoding steps that might be required in some cases. This step is sometimes needed to eliminate long runs of consecutive zeros at either end of a codeword. The goal is to have at most 5 consecutive zeros at either end. This way, when codewords are concatenated and a parity bit is inserted, there are most 11 consecutive zeros. After main encoding steps are completed, it is determined which of the following four statements is true for the codeword out(1:33): (1) there are not 6 consecutive zeros at either the left or the right end of the codeword; (2) there are 6 consecutive zeros at the left end of the codeword; (3) there are 6 consecutive zeros at the right end of the codeword; and (4) there are 6 consecutive zeros at both the left end and the right end of the codeword.

For most of codewords, only statement (1) is true. In this case, the word out(1:33) is sent unchanged to the output of the encoder. If statement(2) is true, the codeword out(1:33) is mapped to codeword out2(1:33) according to the following rules: out2(15:20)=(1 0 0 0 0 1); out2(1:14)=out(7:20); and out2(21:33). In other words, a portion of the codeword is shifted 6 positions to the left which puts the bits 100001 in the middle. These six bits are referred to as a "shift signature". It should be noted that codeword out(1:33) can not have "000" in positions out(16), out(17), out(18) because this would indicated that there was a violation in the codeword, (out(17)=0), but there was no violation in the left half, (out(16)=0), and there was no violation in the right half, (out(18)=0). Therefore the "shift signature" can indicate during the decode process that the shift had occurred.

If statement (3) is true, then the codeword out(1:33) is mapped to codeword out2(1:33) according to the following rules: out2(15:20)=(1 0 0 0 1 1); out2(1:14)=out(1:14); and out2(21:33)=out(15:27). If statement (4) is true, then the codeword out(1:33) is mapped to codeword out2(1:33) according to the following rules: out2(15:20)=(1 0 0 0 1 0); out2(1:14)=out(7:20); out2(21:26)=(1 1 1 1 1 1); and out2(27:33)=out(21:27).

A decoder is designed and constructed to perform the inverse of the steps of the encoder in order to recreate in(1:32) from out(1:33). The first step for the decoder is to determine whether any post processing of out(1:33) was done to create out2(1:33) and to eliminate any long consecutive zero sequences at the beginning or end of the codeword out(1:33). By looking at bit positions 16, 17 and 18 it is easy to determine that the post processing was done when all three bit positions contain a zero. If all three bit positions contain a zero, then the output codeword is out2(1:33) which created by processing out(1:33) to eliminate any long sequences of zeros at the ends of the codeword. By locking at out2(15:20), the information needed to recreate out(1:33) is obtained. A logical zero in positions 16, 17 and 18 is only possible if there was post processing since out(17)=0 indicates a code violation, but out(16)=0 indicates no violation in the left half, and out(18)=0 indicates no violation in the right half.

Once out(1:33) is determined, then looking at out(17) indicates if any further manipulation of the data is required. If out(17)=1, there are no codeword violations and in(32)= out(1:16), out(18:33). If out(17)=0, then there were RLL codeword violations that were corrected and a reverse of the encoding steps must be done to recreate in(1:32). A violation in the left half the original input word is indicated by out(16)=1, and out(18)=1 will indicate that a right half violation of the RLL coding rules. A left half odd interleave violation is indicated by out(14)=1 and an even interleave violation in the original input signal, in(1:32), is indicated by out(12)=1. If the right half of the original input signal in(1:32) does not have any codeword violations then out(10) will contain in(17). A right half odd interleave violation in the original in(1:32) will be indicated by out(20)=1, and an even interleave violation will be indicated by out(22)=1. If there was no left half violation in in(1:32) then out(24) will contain in(16). By looking at the indicators in out(12), out(14), out(16), out(17), out(18), out(20), out(22) and the coded 8 bit word, the original input signal in(1:32) can be recreated from the output codeword out(1:33) by reversing the steps by which the output codeword out(1:33) was created.

BRIEF DESCRIPTION OF THE DRAWINGS

This invention will be described with reference to the accompanying drawings, wherein:

FIGS. 1a and 1b show an overview of the code structure for this invention,

FIG. 2 shows Table A used for looking up violations and pointing to replacement code in shown in Table B, FIGS. 3a and 3b show the location of code violation flag bits for the left half and right half of a thirty two bit word, FIGS. 7a, 7b and 7c are flow diagrams for correcting a code word where one interleave in the right half is invalid.

DETAILED DESCRIPTION OF THE PREFERRED EMBODIMENT

Figure 4:
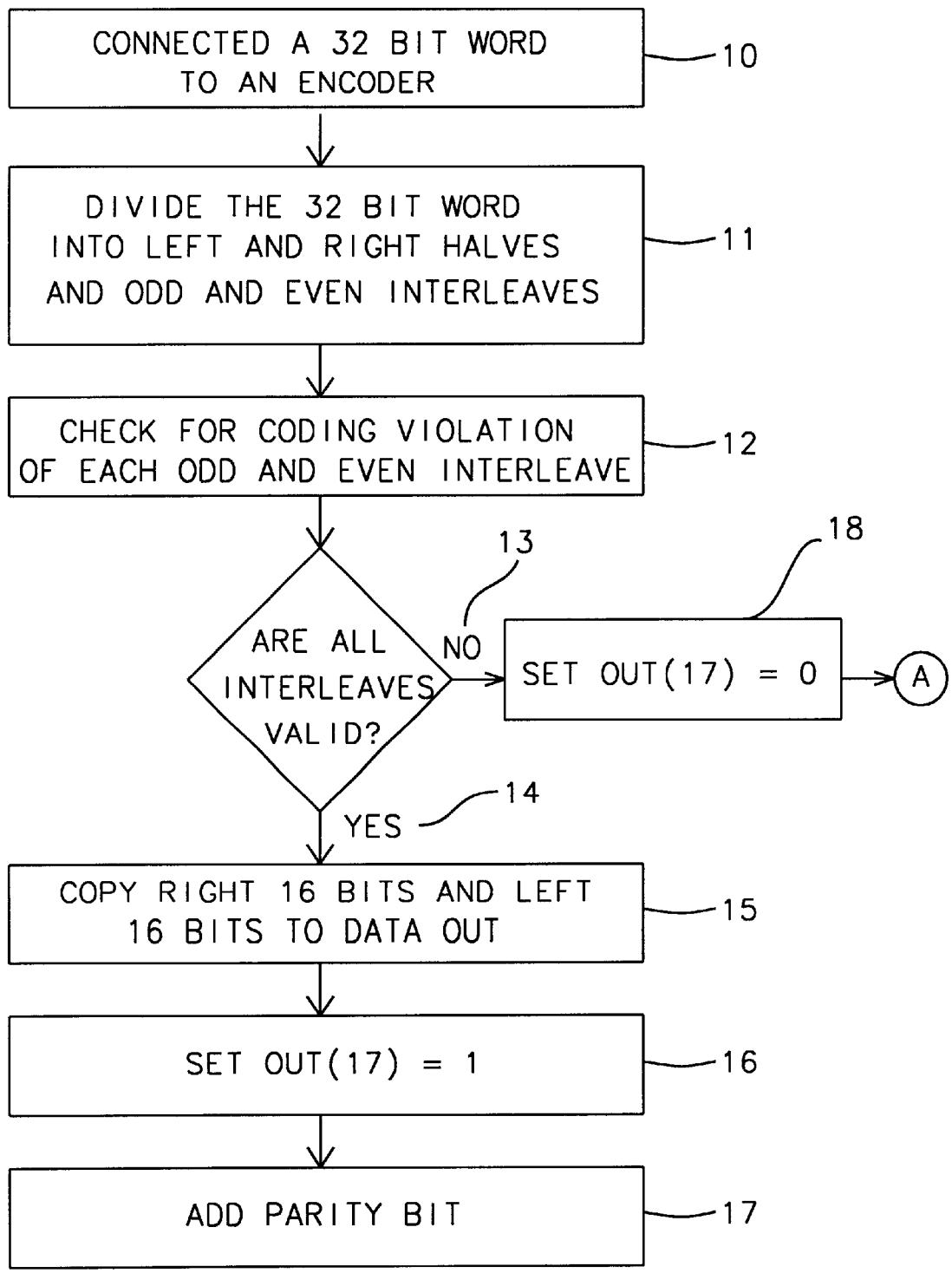
FIG. 4 is a flow diagram showing the initial procedures for determining the validity of a code word to coding constraints.

In FIG. 1a is shown an input word IN applied to an encoder to produce a coded output word OUT. The input word IN is made up of thirty two bits and the coded output word OUT is a thirty three bit word plus parity P. The encoder follows a set of rules to translate the thirty-two bit input word IN into the thirty-three bit output word OUT. The notation IN(1:32) within the encoder block is shorthand for the input word starting at bit "1" and ending at bit "32". The same short hand applies to OUT(1:33). After the thirty-three bit output word is formed a parity bit P is added which makes the output word OUT thirty-four bits long, OUT (1:34).

In FIG. 1b is shown the mapping of the input word IN(1:32) through the encoder into the output code word OUT(1:33). The thirty fourth bit position in the OUT code word is the parity bit designated as "P". The left half of the bit positions of IN={in(1), in(2), in(3), ... in(15), in(16)} map directly into the left half bit positions of the code word OUT={out(1), out(2), out(3), ... out(15), out(16)}. The right half of the bit positions of IN={in(17), in(18), in(19), ... in(31), in(32)} map into one bit position higher in the output code word. OUT={out(18), out(19), out(20), ... out(32), out(33)}. A parity bit is contained in OUT={out(34)} that is calculated after the encoding of OUT from the input code word IN. The seventeenth bit position of the output code word, OUT={out(17)}, is reserved for a flag bit that is the overall violation indicator of the input code word IN.

In FIG. 2 is shown Table A and Table B that are used in encoding the input word IN into the output word OUT. Table A is a list of eight bit words that if found in the odd and even interleaves of the input word IN can produce violations of the coding rules. Thus the eight bit words in table A are called "violations". The coding rules for constructing a thirty three bit RLL code word, OUT, from a thirty two bit input word, IN, is that there should be no more than eleven consecutive logical zeros in the output word OUT, no more than eleven consecutive logical zeros in both odd and even interleaves and a minimum Hamming weight of nine.

Continuing to refer to FIG. 2, in order to determine if the input word IN has a sequence of bits when translated to the output word OUT that would cause a violation of the coding rules, the input word IN is subdivided into eight bit interleaves. IN={intLO, intLE, intRO, intRE} where intLO={in(1), in(3), in(5), ... in in(15)} is the left odd interleave, intLE={in(2), in(4), in(6), ... in (16)} is the left even interleave, intRO={in(17), in(19), in(21), ... in(31)} is the right odd interleave, and intRE={in(18), in(20), in(22), ... in(32)} is the right even interleave. The interleaves, intLO, intLE, intRO, and intRE are each compared to Table A to determine if a violation of the coding rules exist. Once a violation is found the position of the "bad" eight bit word in Table A is used to point to a four bit replacement in Table B. For the right interleaves, intRO, and intRE, the data in the interleaves are directly compared to the eight bit words in Table A, and the four bit word pointed to in Table B is reversed and place into the appropriate right interleave in the output code word OUT. For the left interleaves, intLO and intLE, the data in the interleaves is reversed and compared to the "bad" eight bit words in Table A and the four bit word pointed to in TABLE B is place into the appropriate left interleave in the output code word OUT. For example; if one of the right interleaves such as intRO=10000011, then the four bit replacement word is 1011 which reversed to 1101 and placed into the odd right interleave in the output code word OUT. If one of the left interleaves such as intLO= 1100001, then inLO is reversed to be 10000011 and four bit replacement words is 1011 and placed into the odd left interleave in the output code word OUT.

Figure 10:
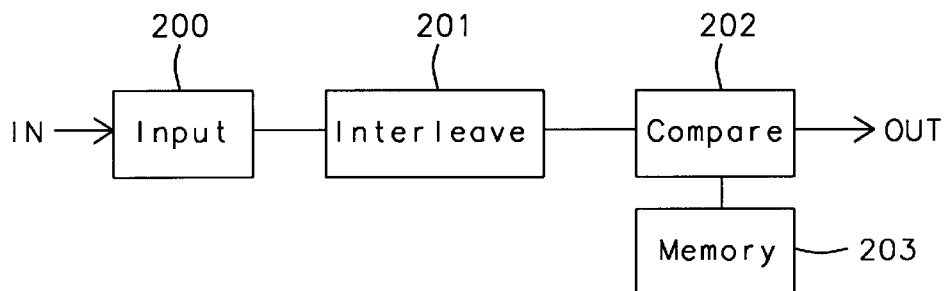
FIG. 10 is a schematic diagram of the preferred embodiment of the present invention.

In FIG. 10 is a circuit diagram of the preferred embodiment of the present invention. The preferred embodiment is implemented as an integrated circuit. As shown therein the integrated circuit comprises an input circuit 200 for receiving the input word IN. An interleaving circuit 201 subdivides the input word into the eight interleaves as described above. A memory 203 stores Table A data and Table B data shown in FIG. 2. Memory 203 may be implemented as a read only memory, nonvolatile or volatile memory, such as dynamic random access memory. Circuit 202 compares the interleaved data from the interleaving circuit 201 to the table data stored in memory 203. The compare circuit determines if there are any violations to Table A and modifies the data IN as explained herein below. The output of the compare circuit 202 is the encoded word OUT shown in FIG. 1a.

FIG. 3a shows the bit positions on the output word that are used to indicate a violation and where the violation occurs. Once bit position out(17) indicates a violation, then bit positions out(16) and out(18) are overwritten with a left half and right half flags, respectively. In both cases the flag is a "1" if there is a violation and a "0" if there is no violation in the respective side. If there is no violation, out(17)=1, then neither side has a violation, bit positions out(1:16) contain the first 16 bits of the input word in(1:16), and out(18:33) contain the second half of the input word in(17:32).

In FIG. 3a is shown the flag bit positions in the code word OUT for coding violations in the left half of the input word, IN, to the encoder. Bit position out(17) is the overall violation indicator and when out(17)=0 there is a code violation in either the left or right halves of the input word. If there is no violation in either half of the input word, IN, then out(17)=1. When there is a violation in the left half of the input word, IN, bit position out(16)=1. When there is no left half violation, out(16)=0. It should be noted here that once out(17)=0 which notes a violation, out(16) will be overwritten with out(16)=1 if there is a left side and out (16)=0 if the left side has no violations. When bit position out(17) indicates a violation, the input bit position in(16) is written into out(24) as noted in FIG. 3b. If the left half odd interleave in the input word has a violation, then out(14)=1 and a reversed Table B for bit word will replace intLO in the coded output word. If the left half even interleave in the input word has a violation, then out(12)=1 and a reversed Table B four bit word will replace intLE in the coded output word.

Referring to FIG. 3b, the flag bit positions in the code word OUT are shown for coding violations in the right half of the input word, IN, to the encoder. Bit position out(17) is the overall violation indicator and when out(17)=0 there is a code violation in either the left or right half of the input word. If there is no violation in either halves of the input word, IN, then out(17)=1. Bit position out(18)=1 when there is a violation in the right half of the input word, IN, and out(16)=1 when there is a violation in the left half. When there is no violation in the left half, out(16)=0, and when there is no violation in the right half, out(18)=0. It should be noted here that once out(17)=0 which notes a violation, out(18) will be overwritten with out(18)=1 if the right side has a violation and out(18)=0 if the right side has no violations. When out(17) indicates a violation, the input bit position in(17), which would normally be written into out (18), is written into out(10) as noted in FIG. 3a. If the odd interleave of the right half of the input word has a violation, then out(20)=1, and a Table B four bit word will replace intRO in the coded output word. If the right half even interleave in the input word has a violation, then out(22)=1 and a Table B four bit word will replace intRE in the coded output word. It should be noted that both the odd and even right half interleaves of the input word must be reversed before finding a violation in Table A which points to the replacement code in Table B.

In FIG. 4 is shown the initial part of the flow diagram for coding a 32 bit word to confirm to RLL restrictions and produce a code word that has a minimum Hamming weight of nine, no more than eleven consecutive logical zero's, and no more than eleven consecutive zero's in both even and odd interleaves. A Hamming weight of nine means that the number of logical ones in a code word is at least nine. In the first step 10 in the flow diagram of FIG. 4 a thirty two bit word is connected to an encoder as shown in FIG. 1a. The thirty two bit word is divided into left and right halves with each containing an odd and an even interleave 11. Each odd and even interleave is checked against the table of "bad" eight bit sequences for code violations 12. If all interleaves have no violations 14, then IN{in(1), in(2), in(3), . . . in(15), in(16)} will be copied into OUT {(out(1), out(2), out(3), . . . out(15), out(16),} and IN {in(17), in(18), in(19), . . . in(31), in(32)} will be copied into OUT {(out(18), out(19), out(20), . . . out(32), out(33)} 15, and the overall violation flag will be set to out(17)=1 indicating that there is no RLL coding violations in the output code word 16. After the output code word from the encoder is produced a parity bit is added 17 making the output code word thirty four bits long out(34)= parity. If any of input word interleaves show a violation 13, then out(17)=0 and the process is continued (A) in FIG. 5a.

Figure 5A:
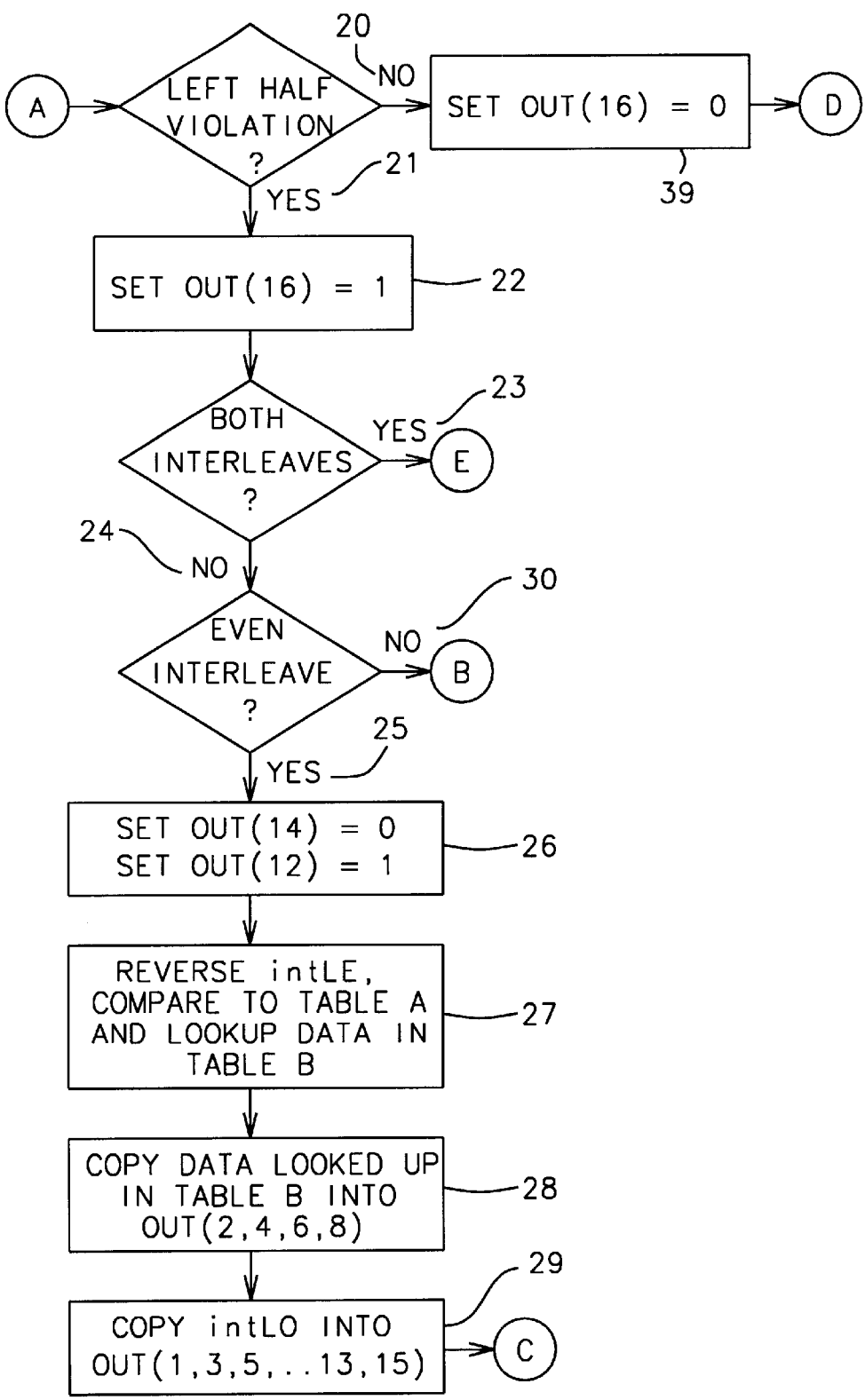
FIGS. 5a and 5b are flow diagrams for correcting a code word where one interleave in the left half is invalid.
Figure 5B:
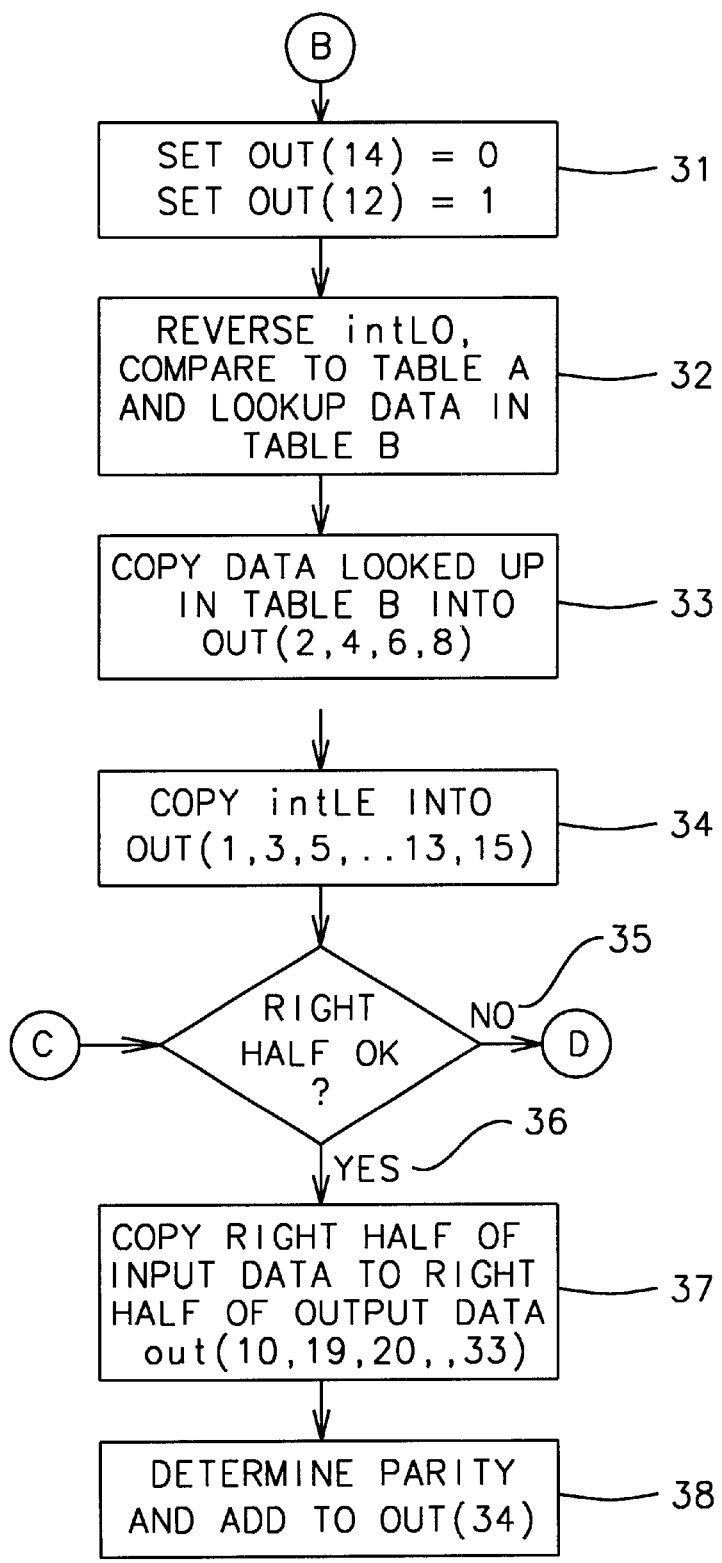
Figure 6:
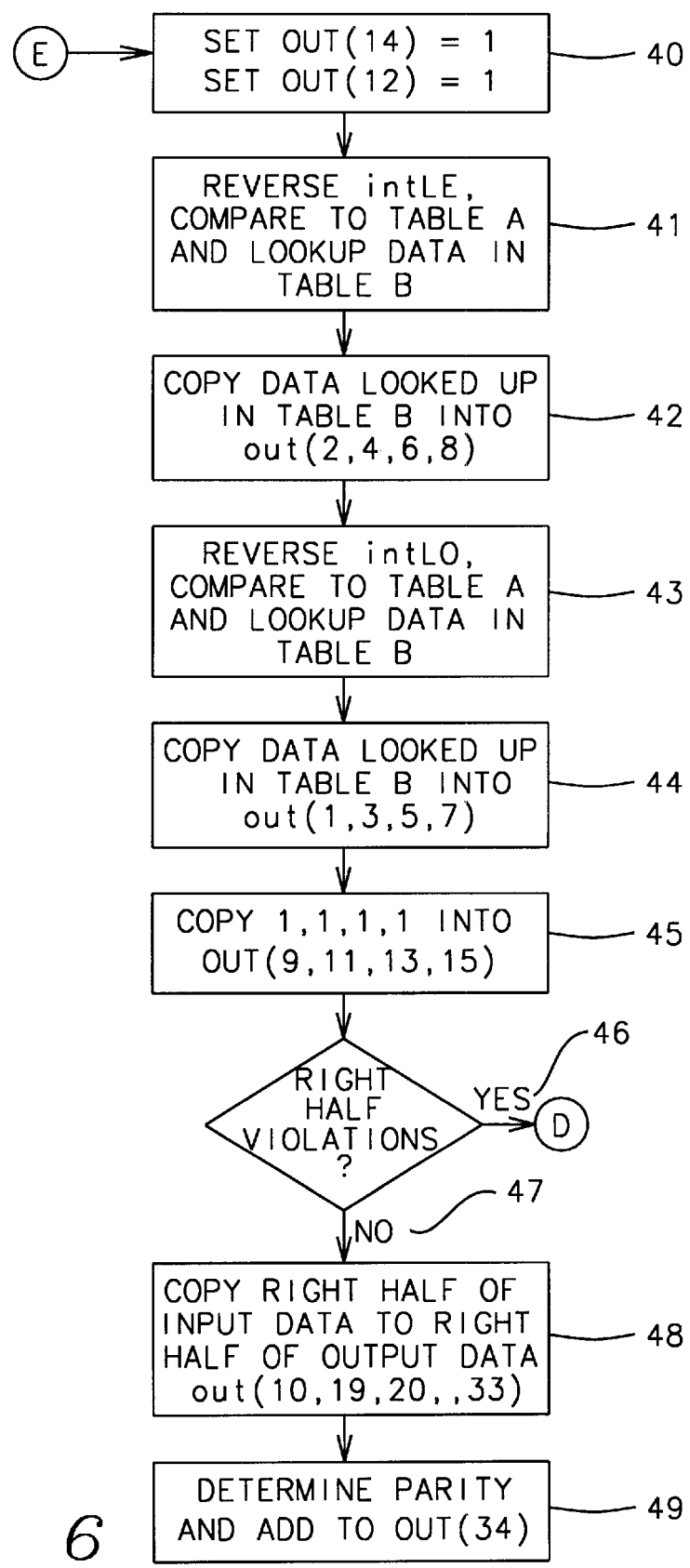
FIG. 6 is a flow diagram for correcting a code word where both interleaves in the left half are invalid.

As can be seen from the flow diagrams in FIG. 5a, FIG. 5b and FIG. 6, bit positions out(12) and out(14) are used to show the location of the violation in the input word. When both interleaves are in violation out(12)=1 and out(14)=1 as shown in FIG. 6. When only the odd interleave has the violation, out(14)=1 and out(12)=0 as shown in FIG. 5b. When only the even interleave has a violation, out(14)=0 and out(12)=1 as shown in FIG. 5a.

Figure 7A:
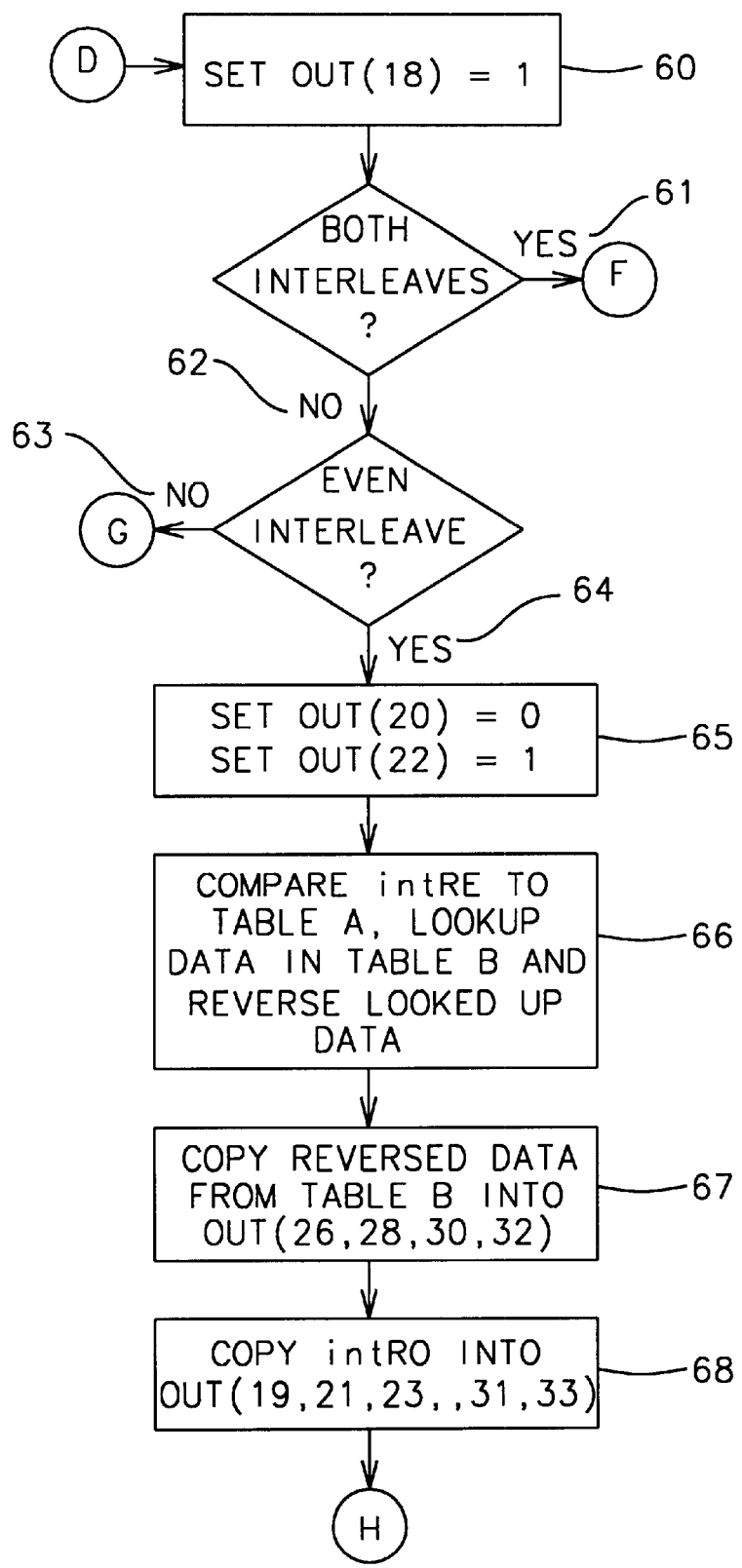

Referring to FIG. 5a, if there is a violation in the left half 21 of the input thirty two bit word, then out(16) is set to a logical one 22; otherwise 20 out(16)=0 and the process continues (D) in FIG. 7a. Continuing with FIG. 5a, if the violation is not in both interleaves 24, but the even interleave is in violation 25, then out(14)=0 and out(12)=1 to show only a violation in the left half even interleave of the input word 26. Next the left even interleave, intLE, is reversed and compared to the "bad" eight bit words in Table A to point to the four bit replacement code in Table B 27. The four bit value looked in Table B is copied to out(2, 4, 6, 8) as a replacement code for the data in the left even interleave of the input word 28. The left odd interleave data, intLO, of the input word is copied to out(1, 3, 5, . . . 13, 15) since no violation was noted with the left odd interleave 29. Continue process (C) in FIG. 5b, if the right half has violations 35, continue process (D) in FIG. 7a; otherwise the right half of the input word is violation free 36, and the right half of the input word in(17, 18, 19, . . . 31, 32) is copied to out(10, 19, 20, . . . 32, 33) shifted one bit position 37 except for out(10)=in(17) which is done to accommodate the flag bit for out(18) for right half violations. Then parity is calculated for the output code word and added to bit position thirty four 38 and the process is complete.

Continuing to refer to FIG. 5a, if the odd interleave has a violation 30, then go to (B) in FIG. 5b. Set out(14)=1 and out(12)=0 to show that only the left half odd interleave has a violation 31. The intLO, is reversed and compared to the "bad" eight bit words in Table A to point to the four bit replacement code in table B 32. The four bit looked up in Table B are copied to out(2, 4, 6, 8) as a replacement code for the data in the left odd interleave of the input word 33. The left even interleave of the input word, intLE is copied in its entirety into out(1, 3, 5, . . . 13, 15)34. If the right half has violations 35, continue process (D) in FIG. 7a; otherwise the right half of the input word is violation free 36. The right half of the input word in(17, 18, 19, . . . 31, 32) is copied to out(10, 19, 20, . . . 32, 33) shifted one bit position 37 except for out(10)=in(17) which is done to accommodate the flag bit out(18) for right half violations. Then parity is calculated for the output code word and added to bit position thirty four 38 and the process is complete.

Continuing to refer to FIG. 5a, if both interleaves of the input word have a violation 23 the process is continued (E) in FIG. 6. Referring to FIG. 6, out(14)=1 and out(12)=1 to indicate both interleaves of the left half of the input word are in violation of the coding rules 40. The left even interleave of the input word is reversed and compared to Table A to point to a four bit replacement code in Table B 41. The four bit replacement code looked up in Table B is copied to out(2, 4, 6, 8) 42. The left odd interleave of the input word is reversed and compared to Table A to point to a second four bit replacement code in Table B 43. The four bit replacement code looked up in Table B is copies to out(1, 3, 5, 7) 44. Four logical ones are inserted into the unused bit positions out(9, 11, 13, 15) of the output code word 45. If there are right half violations 46, the process is continued (D) in FIG. 7; otherwise 47. Continuing to refer to FIG. 6, the right half of the input word with no violations is copied into out(10, 19, 20, 21, . . . 32, 33) 48. Again the bit positions in the right half of the output code word are one bit position higher than in the input word, and out(10)=in(17) to accommodate the right half violation indicator that is placed in out(18). Parity is calculated and added to the output code word in out(34) 49.

Referring to FIG. 7a, the right side violation indicator is set 60, out(18)=1. If both interleaves of the input word are in violation of the coding rules 61, go to (F) in FIG. 8; otherwise 62, if the even interleave of the input word is in violation of the coding rules 64, set the interleave indicators 65, out(20)=0 and out(22)=1. Compare the even interleave of the input word to Table A, lookup the four bit data in Table B and reverse the data looked up in Table B 66. Copy the looked up reversed data from Table B into out(26, 28, 30, 32) 67. Copy the right interleave data of the input word to out(19, 21, 23, . . . 31, 33)68. Go to (H) FIG. 7c.

Referring to FIG. 7a, if the odd interleave has a violation 63, go to (G) FIG. 7b and set the interleave indicators 73, out(20)=1 and out(22)=0. Compare the odd interleave of the input word to Table A, lookup the four bit data in Table B and reverse the data looked up in Table B 74. Copy the looked up reversed data from Table B into out(26, 28, 30, 32) 75. Copy the right interleave data of the input word to out(19, 21, 23, . . . 31, 33) 76. go to (H) FIG. 7c. If there is a left interleave violation of the input word 69, determine parity and insert the parity into out(34) 72. If there was no left half interleave violation 70 copy the left half data of the input word to out(1, 2, 3, . . . 14, 15, 24) 71, where out(24) is used to hold in(16) when there is a violation to keep the left side violation flag from over writing input data. Determine parity and insert into out(34) 72.

Figure 8:
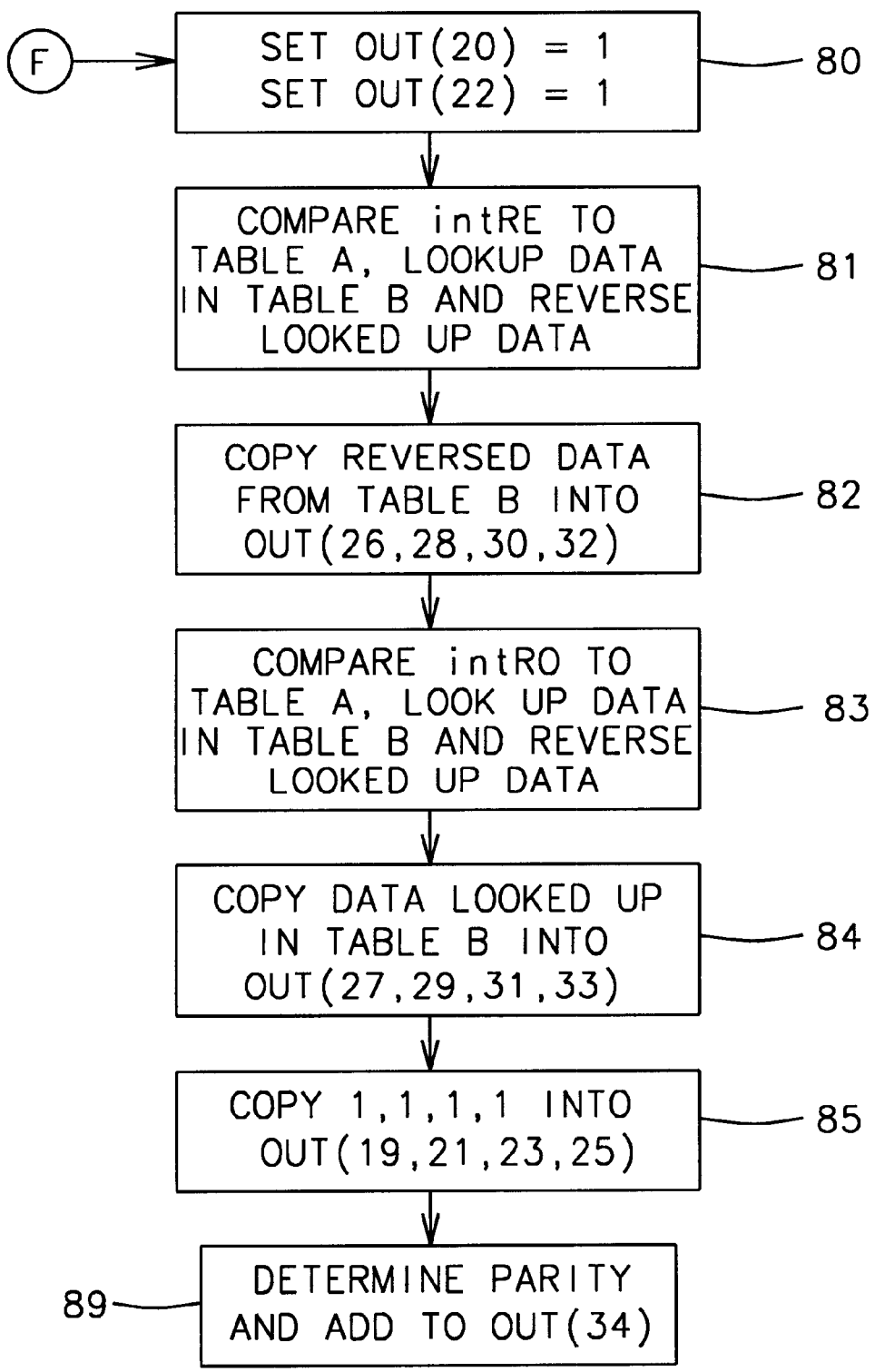
FIG. 8 is a flow diagram for correcting a code word where both interleaves in the right half are invalid.

Referring to FIG. 8, the right even and odd violation flags are both set to show a violation 80, out(20)=1 and out(22)=1. Compare the right even interleave of the input word to Table A, lookup the four bit data in Table B and reverse the data looked up in Table B 81. Copy the locked up and reversed data from Table B into out(26, 28, 30, 32) 82. Compare the odd interleave of the input word to Table A, lookup the four bit data in Table B and reverse the data looked up in Table B 83. Copy the looked up and reversed data from Table B into out(27, 29, 31, 33) 84. Copy (1, 1, 1, 1) into out(19, 21, 23, 25) to fill unused bits in the coded output word 85. Determine parity and insert the parity into out(34) 89.

Figure 9:
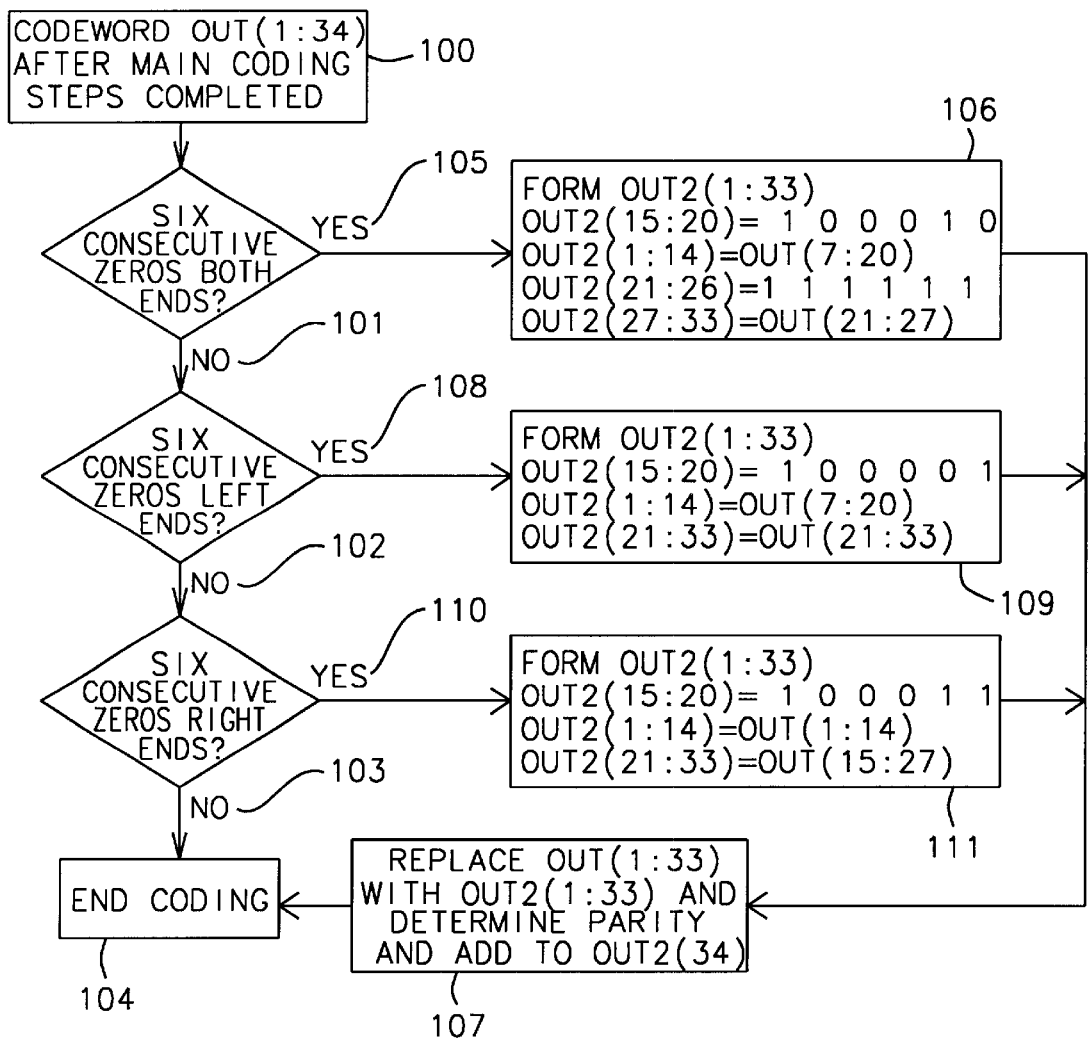
FIG. 9 is a flow diagram for limiting the number of consecutive zeros at left and right ends of a codeword.

Referring to FIG. 9, after encoding the input word IN{1:32} into an output word OUT {1:34}, including parity, an additional encoding step is taken to insure that there is not a long run of zero's from one codeword to the next. This requires looking at the number of consecutive zeros at the beginning and at the end of each codeword and limiting the number of consecutive zeros to be less than six at both the beginning and end of a codeword. Starting with the codeword OUT{1:34}after the main coding steps have been performed 100, the codeword OUT {1:34} is examined. If there are not six consecutive zeros at both the left end and the right end of OUT{1:33} 101, if there are not six consecutive zeros at the left end of OUT{1:34}102, and if there are not 6 consecutive zeros at the right end of OUT{1:34} 103, then the codeword matches the criteria of not having a long series of consecutive zeros that might foul up timing and coding is complete 104.

Continuing to refer to FIG. 9, if out(1:33) has six consecutive zeros at both ends 105, then out2(1:33) is formed, out2(15:20)="1 0 0 0 1 0", out2(1:14)=out(7:20), out2 (21:26)="1 1 1 1 1 1", and out2(27:33)=out(21:27) 106. Next replace out(1:33) with out2(1:33), determine parity for out2(1:33) and add parity to out2(34) 107. Then end coding 104. If out (1:34) has six consecutive zeros at only the left end 108, then out2(1:33) is formed, out2(15:20)="1 0 0 0 0 1", out2(1:14)=out(7:20), out2(21:33)=out(21:33) 108. Replace out(1:33) with out2(1:33), determine parity for out2(1:33) and add parity to out2(34) 107. Then end coding 104. If out(1:34) has six consecutive zeros at only the right end 110, then out2(1:33) is formed, out2(15:20)="1 0 0 0 1 1", out2(1:14)=out(1:14), out2(21:33)=out(15:27) 111. Replace out(1:33) with out2(1:33), determine parity for out2(1:33) and add parity to out2(34) 107. Then end coding 104.

While the invention has been described in conjunction with several specific embodiments, it is evident to those skilled in the art that many further alternatives, modifications and variations will be apparent in light of the foregoing description. More specifically, while the encoder of the present invention is implemented as an integrated circuit, it is contemplated that the present invention may also be implemented as discrete components, or a general purpose processor operated in accordance with program code instructions, or computer program, or combination thereof. These program code instructions can be obtained from a medium, such as a network, local area network, the Internet or storage devices. Such storage devices include, by way of example, magnetic storage devices, optical storage devices, electronic storage devices, magneto-optical device and the like. Thus, the invention described herein is intended to embrace all such alternatives, modifications, applications and variations as may fall within the spirit and scope of the appended claims.

What is claimed is:

1. A run length limited encoder comprising:
an input circuit to receive input data;
a memory having a first portion to store violation data and a second portion to store replacement data corresponding to the violation data;
an interleaving circuit that identifies an N bit even interleaved portion and an M bit odd interleaved portion from the input data received by said input circuit into;
a comparator that
   compares the N bit even interleaved portion with the violation data stored in the first portion of said memory and if there is a match provides an output in accordance with the replacement data stored in the second portion of said memory and if there is no match provides the N bit even interleaved portion as the output;
   compares the M bit odd interleaved portion with the violation data stored in the first portion of said memory and if there is a match provides the output in accordance with the replacement data stored in the second portion of said memory and if there is no match provides the M bit odd interleaved portion as the output;
an encoder to provide an encoded signal in accordance with the output of said comparator, wherein the encoded signal comprises:
   at most a predetermined number of consecutive logical zeros,
   at most a predetermined number of consecutive logical zeros in both the N bit even interleaved portion and the M bit add interleaved portion,
   at least a predetermined Hamming weight,
wherein the predetermined number of consecutive logical zeros is eleven.

2. A run length limited encoder comprising:
an input circuit to receive input data;
a memory having a first portion to store violation data and a second portion to store replacement data corresponding to the violation data;
an interleaving circuit that identifies an N bit even interleaved portion and an M bit odd interleaved portion from the input data received by said input circuit into;
a comparator that
   compares the N bit even interleaved portion with the violation data stored in the first portion of said memory and if there is a match provides an output in accordance with the replacement data stored in the second portion of said memory and if there is no match provides the N bit even interleaved portion as the output;
   compares the M bit odd interleaved portion with the violation data stored in the first portion of said memory and if there is a match provides the output in accordance with the replacement data stored in the second portion of said memory and if there is no match provides the M bit odd interleaved portion as the output;
an encoder to provide an encoded signal in accordance with the output of said comparator, wherein the encoded signal comprises;
   at most a predetermined number of consecutive logical zeros,
   at most a predetermined number of consecutive logical zeros in both the N bit even interleaved portion and the M bit add interleaved portion, at least a predetermined Hamming weight, wherein there are predetermined number of consecutive logical zeros in both the N bit even interleaved portion and the M bit odd interleaved portion.

3. A run length limited encoder comprising:

an input circuit to receive input data;

a memory having a first portion to store violation data and a second portion to store replacement data corresponding to the violation data;

an interleaving circuit that identifies an N bit even interleaved portion and an M bit odd interleaved portion from the input data received by said input circuit into;

a comparator that compares the N bit even interleaved portion with the violation data stored in the first portion of said memory and if there is a match provides an output in accordance with the replacement data stored in the second portion of said memory and if there is no match provides the N bit even interleaved portion as the output;

compares the M bit odd interleaved portion with the violation data stored in the first portion of said memory and if there is a match provides the output in accordance with the replacement data stored in the second portion of said memory and if there is no match provides the M bit odd interleaved portion as the output;

an encoder to provide an encoded signal in accordance with the output of said comparator, wherein the encoded signal comprises;

at most a predetermined number of consecutive logical zeros, at most a predetermined number of consecutive logical zeros in both the N bit even interleaved portion and the M bit add interleaved portion, at least a predetermined Hamming weight, wherein the predetermined Hamming weight is nine.

4. A run length limited encoder comprising:

an input circuit to receive input data;

a memory having a first portion to store violation data and a second portion to store replacement data corresponding to the violation data;

an interleaving circuit that identifies an N bit even interleaved portion and and M bit odd interleaved portion from the input data received by said input circuit into;

a comparator that compares the N bit even interleaved portion with the violation data stored in the first portion of said memory and if there is a match provides an output in accordance with the replacement data stored in the second portion of said memory and if there is no match provides the N bit even interleaved portion as the output;

compares the M bit odd interleaved portion with the violation data stored in the first portion of said memory and if there is a match provides the output in accordance with the replacement data stored in the second portion of said memory and if there is no match provides the M bit odd interleaved portion as the output;

an encoder to provide an encoded signal in accordance with the output of said comparator, wherein the encoded signal comprises;

at most a predetermined number of consecutive logical zeros, at most a predetermined number of consecutive logical zeros in both the N bit even interleaved portion and the M bit add interleaved portion, at least a predetermined Hamming weight, wherein said interleaving circuit further identifies a first portion and second portion of the N bit even interleaved portion and first portion and second portion of the M bit odd interleaved portion.

5. A run length limited encoder according to claim 4, wherein said comparator compares the first portion of the N bit even interleaved portion to the violation data stored in the first portion of said memory and if there is a match outputs the replacement data corresponding thereto in reverse order, and wherein said comparator compares the first portion of the M bit odd interleaved portion to the violation data stored in the first portion of said memory and if there is a match outputs the replacement data corresponding thereto in reverse order.

6. A run length limited encoder according to claim 4, wherein said comparator compares the second portion of the N bit even interleaved portion in reverse order to the violation data stared in the first portion of said memory and if there is a match outputs the replacement data corresponding thereto; and wherein said comparator compares the second portion of the M bit odd interleaved portion in reverse order to the violation data stored in the first portion of said memory and if there is a match outputs the replacement data corresponding thereto.

7. A run length limited encoder comprising:

an input circuit to receive input data;

a memory having a first portion to store violation data and a second portion to store replacement data corresponding to the violation data;

an interleaving circuit that identifies an N bit even interleaved portion and an M bit odd interleaved portion from the input data received by said input circuit into;

a comparator that compares the N bit even interleaved portion with the violation data stored in the first portion of said memory and if there is a match provides an output in accordance with the replacement data stored in the second portion of said memory and if there is no match provides the N bit even interleaved portion as the output;

compares the M bit odd interleaved portion with the violation data stored in the first portion of said memory and if there is a match provides the output in accordance with the replacement data stored in the second portion of said memory and if there is no match provides the M bit odd interleaved portion as the output;

an encoder to provide an encoded signal in accordance with the output of said comparator, wherein the encoded signal comprises;

at most a predetermined number of consecutive logical zeros, at most a predetermined number of consecutive logical zeros in both the N bit even interleaved portion and the M bit add interleaved portion, at least a predetermined Hamming weight, wherein said encoder provides parity data to the encoded signal.

8. A run length limited encoding means comprising:

input means for receiving input data;

memory means having a first portion for storing violation data end a second portion for storing replacement data corresponding to the violation data;

interleaving means for identifying an N bit even interleaved portion and an M bit odd interleaved portion from the input data received by said input means into;

a comparing means for comparing the N bit even interleaved portion with the violation data stored in the first portion of said memory means and if there is a match provides an output in accordance with the replacement data stored in the second portion of said memory means and if there is no match provides the N bit even interleaved portion as the output;

the M bit odd interleaved portion with the violation data stored in the first portion of said memory means and if there is a match provides the output in accordance with the replacement data stored in the second portion of said memory means and if then is no match provides the M bit odd interleaved portion as the output;

encoding means for providing an encoded signal in accordance with the output of said comparing means, wherein the encoded signal comprises:

at most a predetermined number of consecutive logical zeros, at most a predetermined number of consecutive logical zeros in both the N bit even interleaved portion and the M bit odd interleaved portion, at least a predetermined Hamming weight, wherein the predetermined number of consecutive logical zeros is eleven.

9. A run length limited encoding means comprising:

input means for receiving input data;

memory means having a first portion for storing violation data end a second portion for storing replacement data corresponding to the violation data;

interleaving means for identifying an N bit even interleaved portion and an M bit odd interleaved portion from the input data received by said input means into;

a comparing means for comparing the N bit even interleaved portion with the violation data stored in the first portion of said memory means and if there is a match provides an output in accordance with the replacement data stored in the second portion of said memory means and if there is no match provides the N bit even interleaved portion as the output;

the M bit odd interleaved portion with the violation data stored in the first portion of said memory means and if there is a match provides the output in accordance with the replacement data stored in the second portion of said memory means and if then is no match provides the M bit odd interleaved portion as the output;

encoding means for providing an encoded signal in accordance with the output of said comparing means, wherein the encoded signal comprises:

at most a predetermined number of consecutives logical zeros, at most a predetermined number of consecutives logical zeros in both the N bit even interleaved portion and the M bit odd interleaved portion, at least a predetermined Hamming weight, wherein there are predetermined number of consecutive logical zeros in both the N bit even interleaved portion and the M bit add interleaved portion.

10. A run length limited encoding means comprising:

input means for receiving input data;

memory means having a first portion for storing violation data end a second portion for storing replacement data corresponding to the violation data;

interleaving means for identifying an N bit even interleaved portion and an M bit odd interleaved portion from the input data received by said input means into;

a comparing means for comparing the N bit even interleaved portion with the violation data stored in the first portion of said memory means and if there is a match provides an output in accordance with the replacement data stored in the second portion of said memory means and if there is no match provides the N bit even interleaved portion as the output;

the M bit odd interleaved portion with the violation data stored in the first portion of said memory means and if there is a match provides the output in accordance with the replacement data stored in the second portion of said memory means and if then is no match provides the M bit odd interleaved portion as the output;

encoding means for providing an encoded signal in accordance with the output of said comparing means, wherein the encoded signal comprises:

at most a predetermined number of consecutive logical zeros, at most a predetermined number of consecutive logical zeros in both the N bit even interleaved portion and the M bit odd interleaved portion, at least a predetermined Hamming weight, wherein the predetermined hamming weight is nine.

11. A run length limited encoding means comprising:

input means for receiving input data;

memory means having a first portion for storing violation data end a second portion for storing replacement data corresponding to the violation data;

interleaving means for identifying an N bit even interleaved portion and an M bit odd interleaved portion from the input data received by said input means into;

a comparing means for comparing the N bit even interleaved portion with the violation data stored in the first portion of said memory means and if there is a match provides an output in accordance with the replacement data stored in the second portion of said memory means and if there is no match provides the N bit even interleaved portion as the output;

the M bit odd interleaved portion with the violatioin data stored in the first portion of said memory means and if there is a match provides the output in accordance with the replacement data stored in the second portion of said memory means and if then is no match provides the M bit odd interleaved portion as the output;

encoding means for providing an encoded signal in accordance with the output of said comparing means, wherein the encoded signal comprises:

at most a predetermined number of consecutive logical zeros, at most a predetermined number of consecutive logical zeros in both the N bit even interleaved portion and the M bit odd interleaved portion, at least a predetermined Hamming weight, wherein said interleaving means further identifies a first portion and second portion of the N bit even interleaved portion and a first portion and second portion of the M bit odd interleaved portion.

12. A run length limited encoding means according to claim 11, wherein said comparing means compares the first portion of the N bit even interleaved portion to the violation data stored in the first portion of said memory means and if there is a match outputs the replacement data corresponding thereto in reverse order; and wherein said comparing means compares the first portion of the M bit odd interleaved portion to the violation data stored in the first portion of said memory means and if there is a match outputs the replacement data corresponding thereto in reverse order.

13. A run length limited encoding means according to claim 11, wherein said comparing means compares the second portion of the N bit even interleaved portion in reverse order to the violation data stored in the first portion of said memory means and if there is a match outputs the replacement data corresponding thereto; and wherein said comparing means compares the second portion of the M bit odd interleaved portion in reverse order to the violation data stored in the first portion of said memory means and if there is a match outputs the replacement data corresponding thereto.

14. A run length limited encoding means according to claim 11, wherein said encoding means provides parity data to the encoded signal.

15. A method for run length limited encoding of input data comprising the steps of:
  (a) storing violation data;
  (b) storing replacement data corresponding to the violation data;
  (c) identifying an N bit even interleaved portion of the input data and an M bit odd interleaved portion of the input;
  (d) comparing the N bit even interleaved portion with the violation data and if there is a match providing an output in accordance with the replacement data and if there is no match providing the N bit even interleaved portion as the output;
  (e) comparing the M bit odd interleaved portion with the violation data and if there is a match providing the output in accordance with the replacement data and if there is no match providing the M bit odd interleaved portion as the output;
  (f) providing an encoded signal in accordance with the output of steps (d) and (e), wherein the encoded signal comprises:
    at most a predetermined number of consecutive logical zeros,
    at most a predetermined number of consecutive logical zeros in both the N bit even interleaved portion and the M bit odd interleaved portion,
    at least a predetermined Hamming weight.

16. A method according to claim 15, wherein the predetermined number of consecutive logical zeros is eleven.

17. A method according to claim 15, wherein the predetermined number of consecutive logical zeros in both the N bit even interleaved portion and the M bit odd interleaved portion.

18. A method according to claim 15, wherein the predetermined Hamming weight is nine.

19. A method according to claim 15, wherein said interleaving means further identifies a first portion and second portion of the N bit even interleaved portion and a first portion and second portion of the M bit odd interleaved portion.

20. A method according to claim 19, further comprising the steps of:
  comparing the first portion of the N bit even interleaved portion to the violation data and if there is a match outputting the replacement data corresponding thereto in reverse order; and
  comparing the first portion of the M bit odd interleaved portion to the violation data and if there is a match outputting the replacement data corresponding thereto in reverse order.

21. A method according to claim 19, further comprising the steps of:
  comparing the second portion of the N bit even interleaved portion in reverse order to the violation data and if there is a match outputting the replacement data corresponding thereto; and
  comparing the second portion of the M bit odd interleaved portion in reverse order to the violation data and if there is a match outputting the replacement data corresponding thereto.

22. A method according to claim 19, further comprising the step of providing parity data to the encoded signal.

23. A computer program embodied in a medium for run length limited encoding of input data comprising the step of:
  (a) storing violation data;
  (b) storing replacement data corresponding to the violatio data;
  (c) identifying an N bit even interleaved portion of the input data and an M bit odd interleaved portion of the input;
  (d) comparing the N bit even interleaved portion with the violation data and if there is a match providing an output in accordance with the replacement data and if there is no match providing the N bit even interleaved portion has the output;
  (e) comparing the M bit add interleaved portion with the violation data and if there is a match providing the output in accordance with the replacement data and if there is no match providing the M bit odd interleaved portion as the output;
  (f) providing an encoded signal in accordance with the output of steps (d) and (e), wherein the encoded signal comprises:
    at most a predetermined number of consecutive logical zeros,
    at most a predetermined number of consecutive logical zeros in both the N bit even interleaved portion and the M bit odd interleaved portion,
    at least a predetermined Hamming weight.

24. A computer program according to claim 23, wherein the predetermined number of consecutive logical zeros is eleven.

25. A computer program according to claim 23, wherein the predetermined number of consecutive logical zeros in both the N bit even interleaved portion and the M bit odd interleaved portion.

26. A computer program according to claim 23, wherein the predetermined Hamming weight is nine.

27. A computer program according to claim 23, wherein said interleaving means further identifies a first portion and second portion of the N bit even interleaved portion and a first portion and second portion of the M bit odd interleaved portion.

28. A computer program according to claim 27, further comprising the steps of:

comparing the first portion of the N bit even interleaved portion to the violation data and if there is a match outputting the replacement data corresponding thereto in reverse order; and comparing the first portion of the M bit odd interleaved portion to the violation data and if there is a match outputting the replacement data corresponding thereto in reverse order.

29. A computer program according to claim 27, further comprising the steps of:

comparing the second portion of the N bit even interleaved portion in reverse order to the violation data and if there is a match outputting the replacement data corresponding thereto; and comparing the second portion of the M bit odd interleaved portion in reverse order to the violation data and if there is a match outputting the replacement data corresponding thereto.

30. A computer program according to claim 23, further comprising the step of providing parity data to the encoded signal.

* * * * *